United States Patent
Park et al.

(10) Patent No.: US 10,384,431 B2
(45) Date of Patent: Aug. 20, 2019

(54) METHODS FOR FORMING A SUBSTRATE STRUCTURE FOR AN ELECTRICAL COMPONENT AND AN APPARATUS FOR APPLYING PRESSURE TO AN ELECTRICALLY INSULATING LAMINATE LOCATED ON A CORE SUBSTRATE

(71) Applicant: Intel Corporation, Santa Clara, CA (US)

(72) Inventors: Ji Yong Park, Chandler, AZ (US); Sri Chaitra J. Chavali, Chandler, AZ (US); Siddharth K. Alur, Chandler, AZ (US); Kyu Oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 15/475,157

(22) Filed: Mar. 31, 2017

(65) Prior Publication Data

US 2018/0281374 A1  Oct. 4, 2018

(51) Int. Cl.
| | |
|---|---|
| *B32B 37/10* | (2006.01) |
| *H05K 3/46* | (2006.01) |
| *H05K 3/00* | (2006.01) |
| *B32B 37/06* | (2006.01) |
| *H05K 3/02* | (2006.01) |

(52) U.S. Cl.
CPC ............. *B32B 37/10* (2013.01); *B32B 37/06* (2013.01); *H05K 3/0064* (2013.01); *H05K 3/4602* (2013.01); *B32B 2307/202* (2013.01); *B32B 2309/02* (2013.01); *B32B 2457/08* (2013.01); *H05K 3/022* (2013.01); *H05K 2203/0278* (2013.01); *H05K 2203/068* (2013.01)

(58) Field of Classification Search
USPC .................................. 156/247, 308.2, 309.6
See application file for complete search history.

(56) References Cited

U.S. PATENT DOCUMENTS

| | | | | | |
|---|---|---|---|---|---|
| 4,172,907 | A | * | 10/1979 | Mones ..................... | H01L 21/56 257/E21.502 |
| 4,671,984 | A | * | 6/1987 | Maeda ..................... | C08L 23/08 428/209 |
| 5,111,278 | A | * | 5/1992 | Eichelberger ......... | H01L 23/473 257/698 |

(Continued)

*Primary Examiner* — Sing P Chan
(74) *Attorney, Agent, or Firm* — 2SPL Patent Attorneys PartG mbB

(57) ABSTRACT

A method for forming a substrate structure for an electrical component includes placing an electrically insulating laminate on a substrate and applying hot pressure to the electrically insulating laminate by a heatable plate. An average temperature of a surface temperature distribution within a center area of the heatable plate is higher than 80° C. during applying the hot pressure. Further, an edge area of the heatable plate laterally surrounds the center area and a temperature of the heatable plate within the edge area decreases from the center area towards an edge of the heatable plate during applying the hot pressure. A temperature at a location located vertically above an edge of the substrate during applying the hot pressure is at least 5° C. lower than the average temperature of the surface temperature distribution within the center area.

24 Claims, 3 Drawing Sheets

(56) References Cited

U.S. PATENT DOCUMENTS

| | | | | |
|---|---|---|---|---|
| 5,838,568 A | * | 11/1998 | Dickinson | G01R 31/2817 |
| | | | | 700/121 |
| 6,113,724 A | * | 9/2000 | Ogawa | B29C 43/56 |
| | | | | 156/212 |
| 2012/0211484 A1 | * | 8/2012 | Zhou | H01L 21/67103 |
| | | | | 219/448.11 |

* cited by examiner

METHODS FOR FORMING A SUBSTRATE STRUCTURE FOR AN ELECTRICAL COMPONENT AND AN APPARATUS FOR APPLYING PRESSURE TO AN ELECTRICALLY INSULATING LAMINATE LOCATED ON A CORE SUBSTRATE

FIELD

Examples relate to concepts for laminating dielectric structures on substrates and in particular to methods for forming a substrate structure for an electrical component and an apparatus for applying pressure to an electrically insulating laminate located on a substrate.

BACKGROUND

Many electrical components comprise wiring layer stacks or interconnection layer stacks on a substrate. For example, layers of these layer stacks can be formed by laminating electrically insulating material on the substrate.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
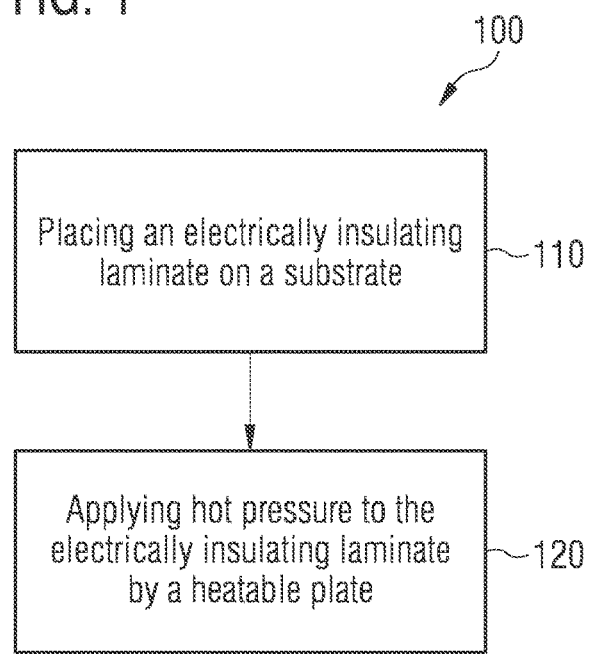
FIG. 1 shows a flow chart of a method for forming a substrate structure for an electrical component.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Electrical components or devices are embedded in packages to provide protection against impact and corrosion, to hold the contact pins or leads and/or to dissipate heat produced by the device, for example. For example, a semiconductor package may contain one or more semiconductor components (e.g. arranged on a package substrate or lead frame). Individual components may be formed in a silicon wafer before being cut and assembled in a package. A semiconductor package may have only few leads or contacts for devices such as diodes, or may have hundreds of contact interfaces (e.g. pads, solder balls or solder bumps) in case of a microprocessor, for example. In addition to providing connections to the semiconductor die and handling waste heat, the semiconductor package can protect the semiconductor die against the ingress of moisture, for example. Similarly, non-semiconductor electrical components (e.g. resistors, capacitors, inductors) may be arranged in packages.

FIG. 1 shows a method for forming a substrate structure for an electrical component according to an example. The method 100 comprises placing 110 an electrically insulating laminate on a substrate (e.g. on a layer of a core substrate) and applying 120 hot pressure to the electrically insulating laminate by a heatable plate. An average temperature of a surface temperature distribution within a center area of the heatable plate is higher than 80° C. during applying the hot pressure. Further, the center area extends over at least 30% of a total area of the heatable plate. An edge area of the heatable plate laterally surrounds the center area. Further, a temperature of the heatable plate within the edge area decreases from the center area towards an edge of the heatable plate during applying the hot pressure. Additionally, a temperature at a location located vertically above an edge of the substrate during applying the hot pressure is at least 5° C. lower than the average temperature of the surface temperature distribution within the center area.

By using a heatable plate with a reduced temperature at the edge of the substrate, a flow of the electrically insulating laminate at the edge of the substrate may be reduced in comparison to the center area. In this way, an outflow of the material of the electrically insulating laminate may be reduced or avoided at the edge of the substrate. Consequently, the thickness uniformity of the electrically insulating laminate over the substrate may be improved. For example, the dielectric thickness uniformity (of the electrically insulating laminate after hot pressure) may be improved and this may help with scalability of bump pitch through better thickness variation (controlled collapse chip connection C4 area thickness variation CTV and/or bump top variation BTV) and/or higher assembly (thermal compression bonding TCB/mass reflow) yields.

The electrically insulating laminate may be placed 110 on the substrate by laying or rolling out the electrically insulating laminate on the substrate. The electrically insulating laminate may comprise a thickness of more than 10 μm (or more than 20 μm or more than 30 μm) and less than 100 μm (or less than 70 μm or less than 50 μm). The electrically insulating laminate may extend over the whole substrate. For example, the electrically insulating laminate may comprise substantially the same lateral size and shape (e.g. rectangle or square shape) as the substrate or may be slightly smaller than the substrate.

The heatable plate may be heated to a desired temperature (e.g. desired average temperature of center area) and may be pressed onto the electrically insulating laminate to apply 120 hot pressure to the electrically insulating laminate. The hot pressure may be a pressure applied at temperatures above 60° C., for example. The hot pressure may be applied 120 for a predefined period of time. After the predefined period of time, the heatable plate is removed from the electrically insulating laminate, for example.

For example, the electrically insulating laminate may be a thermoplastic laminate. Due to the heating, the material of the electrically insulating laminate may get plastic and may adapt itself to the topography of the surface of the substrate. For example, the pressure and temperature applied to the electrically insulating laminate may be selected so that the pressure is higher than the yield strength of the material of the electrically insulating laminate at the selected temperature. The average temperature of the surface temperature distribution within the center area may be selected higher than a glass transition temperature of the electrically insulating laminate. For example, the electrically insulating laminate is a thermoplastic laminate having a glass transition temperature lower than the average temperature of the surface temperature distribution within the center area of the heatable plate during applying 120 the hot pressure. The electrically insulating laminate may be a dielectric laminate (e.g. resin laminate) and/or may comprise or consist of build-up material, solder resist material or pre-preg material.

The heatable plate may be heatable by one or more heater structures embedded in the heatable plate or located at a backside of the heatable plate. The front side surface of the heatable plate may be substantially flat surface. For example, the front side surface of the heatable plate is in contact with the electrically insulating laminate during applying 120 the hot pressure. At least a portion of the front side surface extending over the whole substrate or the whole front side surface of the heatable plate may be formed by the same material (e.g. metal, for example, steel). For example, the heatable plate may comprise or may be a (e.g. stainless) steel plate. For example, a lateral dimension of the heatable plate may be larger than 200 mm (or larger than 400 mm) and smaller than 1 m (or smaller than 700 mm). The lateral dimension of the heatable plate may be a length of a side of the heatable plate. For example, the heatable plate may comprise a rectangular shape or a square shape. A lateral dimension of the (front side surface of the) heatable plate may be at least 1 cm (or at least 5 cm or at least 10 cm) larger than a lateral dimension of the substrate. In this way, the lateral alignment of the heatable plate to the substrate can be done without the need for high accuracy. For example, the heatable plate and/or a control circuit for controlling a temperature of the heatable plate may be configured to generate a desired laterally varying surface temperature distribution at a surface of the heatable plate.

Before bringing the heatable plate in contact with the electrically insulating laminate, the heatable plate may be heated so that the desired temperature distribution exists at the (front side) surface of the heatable plate.

The average temperature of a surface temperature distribution within the center area of the heatable plate is higher than 80° C. (or higher than 100° C. or higher than 120° C.) during applying the hot pressure and/or may be lower than 200° C. (or lower than 150° C. or lower than 130° C.) during applying the hot pressure. The average temperature of the surface temperature distribution within the center area may be a temperature at the (front side) surface of the heatable plate averaged over the center area. The surface temperature distribution may be a two dimensional temperature profile of the center area. The heatable plate may have a low temperature variation within the center area of the heatable plate. For example, a temperature variation within the center area of the heatable plate may be lower than 5° C. (or lower than 3° C. or lower than 2° C.) during applying 120 the hot pressure. The temperature variation within the center area may be the difference between a maximal temperature occurring at the surface of the heatable plate within the center area and a minimal temperature occurring at the surface of the heatable plate within the center area at a point in time during applying 120 the hot pressure. For example, the average temperature of the surface temperature distribution within the center area may vary slightly during applying 120 the hot pressure, but the temperature variation may stay below 5° C. (or lower than 3° C. or lower than 2° C.) during the whole time the hot pressure is applied 120.

The center area may be a portion of the front side surface of the heatable plate located in the middle of the heatable plate. A center of the front side surface of the heatable plate may be located within the center area and the center area extends over at least 30% (or at least 50, at least 70 or at least 90%) of a total area (e.g. total area of the front side surface) of the heatable plate, for example. The center area is surrounded by the edge area being another portion of the front side surface of the heatable plate extending from an edge of the heatable plate towards or to the center area, for example. The center area may be a portion of the surface of the heatable plate having a low temperature variation during applying the hot pressure.

In comparison, the edge area may be a portion of the surface of the heatable plate having a significantly larger temperature variation with a temperature decreasing from the center area to an edge of the heatable plate during applying 120 the hot pressure, for example. The temperature may laterally decrease monotonically, linearly or with one or more local maxima and/or minima (e.g. caused by the routing of one or more heating structures of the heatable plate) from the center area towards the edge of the heatable plate. For example, a maximal temperature within the edge area of the heatable plate during applying the hot pressure occurs at a transition to the center area (e.g. border between center area and edge area) and/or a minimal temperature within the edge area of the heatable plate during applying the hot pressure occurs at the edge of the heatable plate. The edge area of the heatable plate may extend from the center area to the edge of the heatable plate. For example, a smallest distance between the center area and the edge of the heatable plate may be larger than 2% (or larger than 5% or larger than 10%) of a lateral dimension of the heatable plate. The edge area may extend from the edge of the heatable plate to a distance from the edge of the heatable plate of more than 5 cm (or more than 10 cm or more than 15 cm)

or more than 2% (or more than 5% or more than 10%) of a lateral dimension of the heatable plate.

The temperature at a location located vertically above an edge of the substrate during applying the hot pressure is at least 5° C. (or at least 7° C., at least 10° C. or at least 15° C., for example, between 10° C. and 20° C.) lower than the average temperature of the surface temperature distribution within the center area. For example, the location located vertically above the edge of the substrate may be the edge of the heatable plate, if the heatable plate and the substrate comprise the same size and the heatable plate is accurately placed above the substrate. However, the heatable plate may be larger than the substrate so that the location located vertically (e.g. on a line orthogonal to the surface of the heatable plate) above the edge of the substrate may lay within the edge area, but closer to the edge of the heatable plate than the center area. Due to the reduced temperature at the edge of the substrate, an outflow of the material of the electrically insulating laminate may be reduced or avoided. However, some flow may be still desired to enable the electrically insulating laminate to adapt itself to the topography of the surface of the substrate also at an edge area of the substrate. For example, the temperature at the location located vertically above the edge of the substrate during applying 120 the hot pressure may be higher than 60° C. (or higher than 80° C., higher than 100° C. or higher than 120° C.).

The substrate may be an intermediate manufacturing product (e.g. multi-layer core) provided or formed for the further processing to form the substrate structure. For example, the substrate may be a core substrate and the electrically insulating laminate may be placed on the core substrate or on a layer of the core substrate. For example, the substrate or the core substrate may be a polymer multilayer core comprising a plurality of later wiring layers and vertical wiring layers. For example, the substrate may be a panel substrate, a semiconductor wafer or a printed circuit board. Depending on the kind of substrate, a thickness of the substrate is larger than 70 μm (or larger than 100 μm or larger than 200 μm) and lower than 3 mm (or lower than 1 mm or lower than 500 μm), for example. For example, the substrate may be a panel substrate used to form a plurality of substrate units. Optionally, the method 100 may further comprise separating the substrate units of the plurality of substrate units from each other. For example, a lateral dimension of the substrate (e.g. panel substrate) may be larger than 200 mm (or larger than 400 mm) and smaller than 1 m (or smaller than 700 mm). The lateral dimension of the substrate may be a length of a side of the substrate. For example, the substrate may comprise a rectangular shape or a square shape.

For example, a plurality of electrically conductive structures (e.g. lateral wiring portions of substrate interconnections) may be located at a surface of the substrate before placing 110 the electrically insulating laminate on the substrate. Portions of the electrically insulating laminate may be pressed into regions located laterally between the electrically conductive structures of the plurality of electrically conductive structures during applying 120 the hot pressure. After applying 120 the hot pressure, the electrically insulating laminate may cover the plurality of electrically conductive structures and may fill spaces located laterally between the electrically conductive structures of the plurality of electrically conductive structures. For example, the electrically conductive structures of the plurality of electrically conductive structures may protrude from the surface of the substrate by more than 10 μm (or more than 20 μm or more than 30 μm, for example between 15 μm and 40 μm) before placing 110 the electrically insulating laminate on the substrate. For example, a thickness of the electrically insulating laminate on top of the plurality of electrically conductive structures may be larger than 10 μm (or more than 20 μm or more than 30 μm, for example between 15 μm and 40 μm) after applying 120 the hot pressure. The electrically conductive structures may be metal structures (e.g. copper). The method 100 may further comprise forming (e.g. by laser drilling or lithography) openings extending from a surface of the electrically insulating laminate to the plurality of electrically conductive structures after applying the hot pressure. The openings may be used to form vertical electrically conductive structures (e.g. vias) to connect the plurality of electrically conductive structures to further electrically conductive structures to be formed afterwards on top of the electrically insulating laminate. For example, the vertical electrically conductive structures within the openings of the electrically insulating laminate may be formed by electroplating.

Optionally, the method 100 may further comprise applying pressure to the electrically insulating laminate by a rubber plate before applying the hot pressure. The rubber plate may comprise a rubber surface and may comprise the same or a similar lateral size as the heatable plate. The pressure applied by the rubber plate may be applied at room temperature or at a temperature below 60° C., for example.

The substrate structure to be formed may comprise one or more additional wiring layers formed above the electrically insulating laminate after applying 120 the hot pressure. The substrate structure may be a completed substrate panel, semiconductor wafer or printed circuit board or a substrate unit (e.g. semiconductor package substrate unit, a semiconductor die or a printed circuit board unit) obtained by separating the plurality of substrate units implemented at the substrate from each other.

For example, the electrical component may be a processor component (e.g. central processing unit CPU), a memory component, a (wireless or wireline) transmitter component and/or a (wireless or wireline) receiver component or a multi-chip component. For example, the electrical component may comprise the substrate structure (e.g. formed by the described method) forming a package substrate and one or more semiconductor dies located (e.g. soldered or bonded) on the substrate structure. For example, the one or more semiconductor dies may comprise a processor circuit (e.g. central processing unit CPU), a memory circuit, a (wireless or wireline) transmitter circuit and/or a (wireless or wireline) receiver circuit implemented on the one or more semiconductor dies.

For example, a lateral direction or lateral extension may be measured in parallel to the front side of the substrate, the heatable plate or the substrate structure to be formed and a vertical direction, vertical extension or thickness may be measured orthogonal to the front side of the substrate, the heatable plate or the substrate structure to be formed.

A lateral wiring layer (e.g. metal layer of a layer stack of the substrate) may be a layer for implementing lateral electrical connections between vertical electrical connections (vias) connecting lateral wiring layers. A vertical wiring layer (e.g. via layer of a layer stack of the substrate) may be a layer for implementing vertical electrical connections (vias) between lateral wiring layers.

Figure 2:
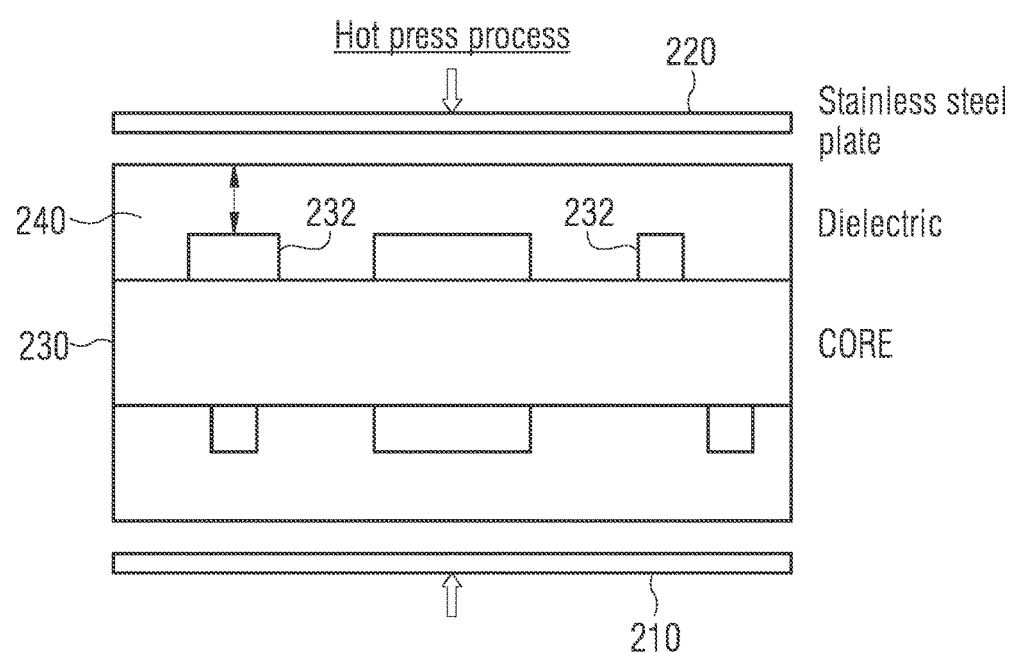
FIG. 2 shows a schematic illustration of a hot press process.

FIG. 2 shows a schematic illustration of a hot press process. The hot press process may be implemented similar to the process of applying hot pressure to an electrically insulating laminate by a heatable plate as described in connection with FIG. 1. A core substrate 230 including electrically conductive structures 232 at a front side and a back side is placed on a carrier structure 210 and a dielectric laminate 240 is placed on the core substrate 230. A stainless steel plate 220 is used to press the dielectric laminate 240 on the core substrate 230 while the stainless steel plate 220 is kept at a desired high temperature. FIG. 2 shows the resulting processed core substrate after applying the hot pressure. The dielectric laminate 240 covers the electrically conductive structures 232 at the front side of the core substrate 230 and fills spaces located laterally between the electrically conductive structures 232.

FIG. 2 may show an example of a hot press process applying a non-uniform temperature on the dielectric, for example, lower temperature along the edge for slower resin flow. For example, the temperature gradient may be formed by using a different thickness of heating element inside.

Figure 3:
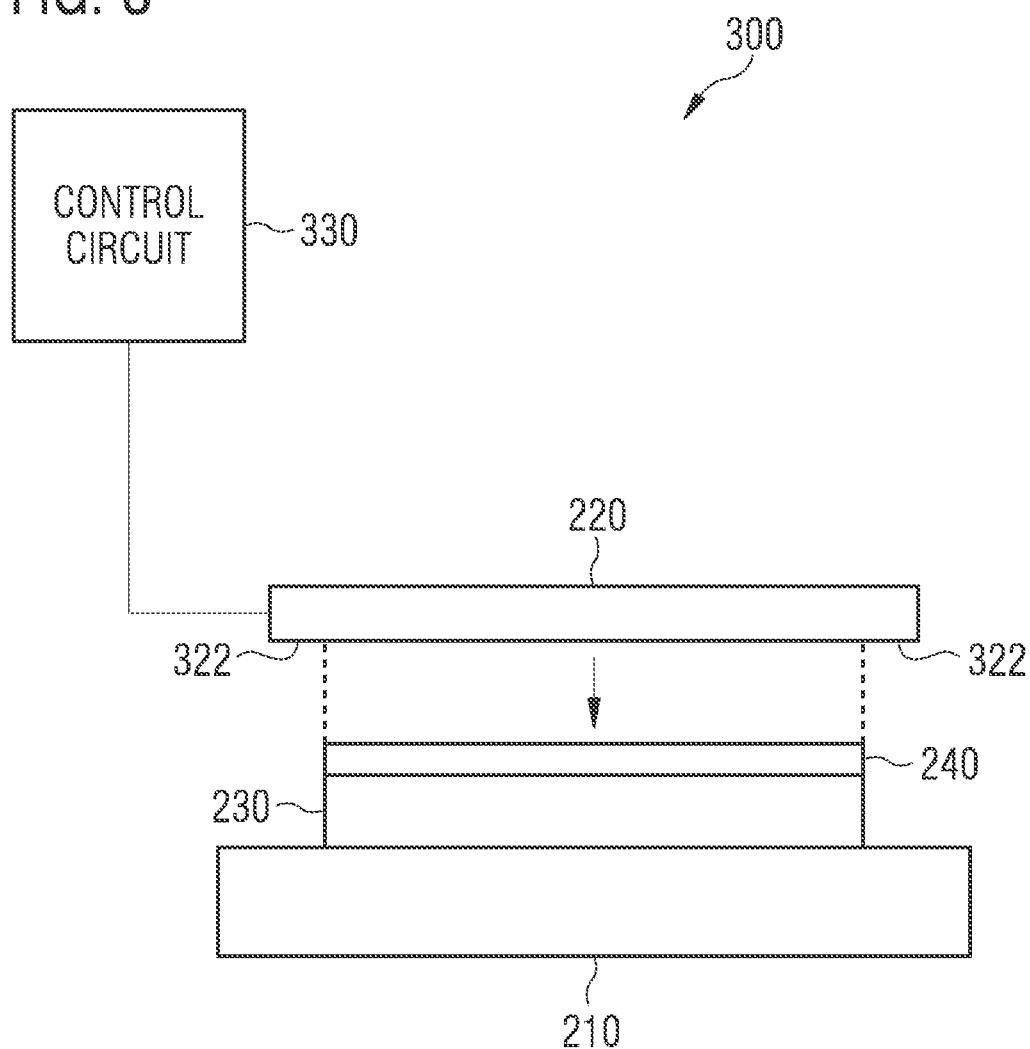
FIG. 3 shows a schematic illustration of an apparatus for applying pressure to an electrically insulating laminate located on a core substrate.

FIG. 3 shows a schematic illustration of an apparatus for applying pressure to an electrically insulating laminate located on a substrate according to an example. The apparatus 300 comprises a carrier structure 210 configured to carry a substrate 230 and a heatable plate 220 configured to apply hot pressure to an electrically insulating laminate 240 located on a substrate 230 carried by the carrier structure 210. The heatable plate 220 is configured to generate a laterally varying surface temperature distribution at a surface of the heatable plate 220 so that an average temperature of a surface temperature distribution within a center area of the heatable plate 220 is higher than 80° C. and a temperature of the heatable plate 220 within an edge area decreases from the center area towards an edge of the heatable plate 220 during applying the hot pressure. Further, a temperature at a location 322 located vertically above an edge of the substrate 230 during applying the hot pressure is at least 5° C. lower than the average temperature of the surface temperature distribution within the center area. The center area extends over at least 30% of a total area of the heatable plate 220 and the edge area of the heatable plate laterally surrounds the center area.

By using a heatable plate with a reduced temperature at the edge of the substrate, a flow of the electrically insulating laminate at the edge of the substrate may be reduced in comparison to the center area. In this way, an outflow of the material of the electrically insulating laminate may be reduced or avoided at the edge of the substrate. Consequently, the thickness uniformity of the electrically insulating laminate over the substrate may be improved.

The heatable plate 220 may comprise one or more heater structures to heat the front side surface of the heatable plate 220 to a desired temperature and obtain a desired temperature distribution at the front side surface of the heatable plate. For example, a heater structure may be a heating filament or heating wire covering the center area with a higher density than the edge area so that a temperature within the edge area is reduced in comparison to a temperature within the center area. For example, the heatable plate 220 may comprise a first heater structure for heating the center area of the heatable plate and a second heater structure for heating the edge area of the heatable plate. The first heater structure may be configured to heat the center area so that the average temperature of the surface temperature distribution within the center area of the heatable plate 220 is higher than 80° C. during applying the hot pressure. The second heater structure may be configured to heat the edge area so that the temperature at the location located vertically above the edge of the substrate 230 during applying the hot pressure is at least 5° C. lower than the average temperature of the surface temperature distribution within the center area. For example, the temperature gradient may be obtained by using a different thickness of a heating element or heating structure within the center area and the edge area.

The temperature distribution at the front side surface of the heatable plate 220 may be controlled inherently by the way the one or more heating structures of the heatable plate are implemented (e.g. varying density of routing or different electrical resistance of the heating structure within different areas) and/or adjustable by a control circuit 330 controlling the current strength of a current led through the one or more heater structures.

For example, the apparatus may comprise a control circuit 330 configured to control the temperature distribution at the surface of the heatable plate 220 during applying the hot pressure.

More details and aspects are mentioned in connection with the examples described above or below. The example shown in FIG. 3 may comprise one or more optional additional features corresponding to one or more aspects mentioned in connection with the proposed concept or one or more examples described above (e.g. FIG. 1 or 2) or below (e.g. FIG. 4).

Figure 4:
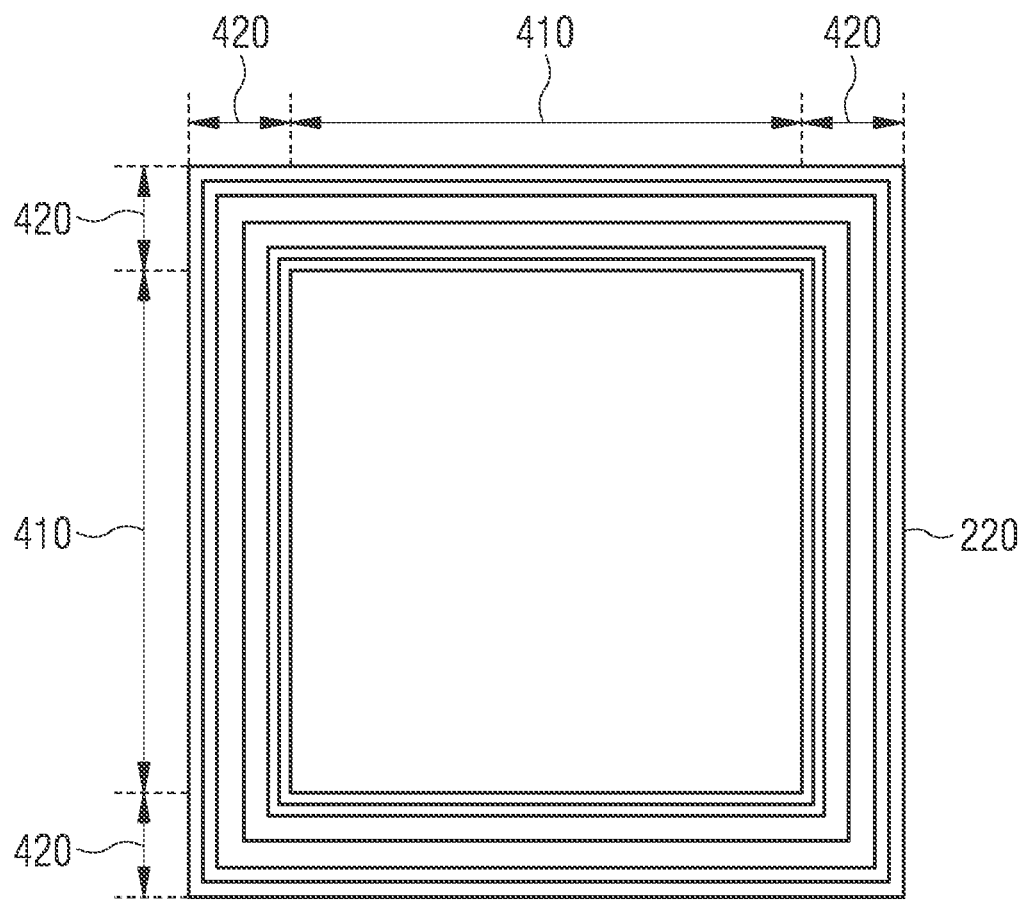
FIG. 4 shows a schematic top view of a heatable plate indicating a laterally varying temperature distribution.

FIG. 4 shows a schematic top view of a heatable plate indicating a laterally varying temperature distribution according to an example. The heatable plate 220 may be implemented similar to the implementation of the heatable plate described in connection with FIG. 1 or 3. A center area 410 of the heatable plate 220 is laterally surrounded by an edge area 420 of the heatable plate 220. The temperature variation within the center area 410 is low and the temperature decreases from the center area 410 to the edge of the heatable plate 220 within the edge area 420. For example, FIG. 4 shows a temperature gradient of the stainless steel plate in a planar view.

More details and aspects are mentioned in connection with the examples described above or below. The example shown in FIG. 4 may comprise one or more optional additional features corresponding to one or more aspects mentioned in connection with the proposed concept or one or more examples described above (e.g. FIG. 1 or 3) or below.

Some examples relate to a non-uniform heater for dielectric lamination. The proposed concept may relate to a heater, lamination, a non uniform heater and/or resin flow and/or to all products which have resin (e.g. build up or solder resist) and/or micro architectures, for example. The proposed concept may be implemented in high volume architectures as computer system architecture features & interfaces made in high volumes, may encompass IA (integrated architectures), devices (e.g. transistors) and associated manufacturing (mfg) processes, for example.

By using other methods, dielectric resin (e.g. build up material, solder resist, pre-preg) flow may be faster on the edge than on the center of the panel. Good pre-preg dielectric resin flow may be required for better CTV (controlled collapse chip connection C4 area thickness variation) and warpage control for better assembly (thermal compression bonding TCB/mass reflow) yield. According to the proposed concept, thickness uniformity may be varied or improved by tool setting (setting temperature profile of heatable plate), for example.

For example, the dielectric flow is dependent on temperature. At low temperature, dielectric flow may be slower than one at high temperature. The resin flow can be controlled by the temperature, for example.

For example, with a non-uniform hot press machine an improvement on resin flow may be obtained to get better CTV (C4 area thickness variation)/BTV (Bump area thickness variation) yield, for example.

Both unit level and panel level may be considered for thickness uniformity. Higher resin flow may be needed for unit level and lower resin flow may be needed for panel level. It may be hard to find a sweet spot in the middle. However, with a non-uniform temperature steel press machine, the material for better unit level uniformity may be chosen (e.g. higher resin flow) and the temperature gradient may be applied to fix the panel level uniformity to slow down the resin flow at the edge to fix the panel level uniformity, for example.

The proposed concept may be used for CPU/processors, Chipsets, graphical devices, wireless devices, mulit-chip/3D packaging including CPU in combo with other devices, memory (e.g. Flash, DRAM or SRAM) and/or boards (e.g. motherboards).

In the following examples pertain to further examples. Example 1 is a method for forming a substrate structure for an electrical component, the method comprising placing an electrically insulating laminate on a substrate; and applying hot pressure to the electrically insulating laminate by a heatable plate, wherein an average temperature of a surface temperature distribution within a center area of the heatable plate is higher than 80° C. during applying the hot pressure, wherein the center area extends over at least 30% of a total area of the heatable plate, wherein an edge area of the heatable plate laterally surrounds the center area, wherein a temperature of the heatable plate within the edge area decreases from the center area towards an edge of the heatable plate during applying the hot pressure, wherein a temperature at a location located vertically above an edge of the substrate during applying the hot pressure is at least 5° C. lower than the average temperature of the surface temperature distribution within the center area.

In example 2, the subject matter of example 1 can optionally include a plurality of electrically conductive structures being located at a surface of the substrate before placing the electrically insulating laminate on the substrate, wherein portions of the electrically insulating laminate are pressed into regions located laterally between the electrically conductive structures of the plurality of electrically conductive structures during applying the hot pressure.

In example 3, the subject matter of example 2 can optionally include the electrically conductive structures of the plurality of electrically conductive structures protruding from the surface of the substrate by more than 10 µm before placing the electrically insulating laminate on the substrate.

In example 4, the subject matter of any of examples 2 to 3 can optionally include comprising forming openings extending from a surface of the electrically insulating laminate to the plurality of electrically conductive structures after applying the hot pressure.

In example 5, the subject matter of examples 1 to 4 can optionally include the electrically insulating laminate being a thermoplastic laminate having a glass transition temperature lower than the average temperature of the surface temperature distribution within the center area of the heatable plate during applying the hot pressure.

In example 6, the subject matter of any of examples 1 to 5 can optionally include the electrically insulating laminate extending over the whole substrate.

In example 7, the subject matter of any of examples 1 to 6 can optionally include the electrically insulating laminate comprising a thickness of more than 10 µm and less than 50 µm.

In example 8, the subject matter of any of examples 1 to 7 can optionally include applying pressure to the electrically insulating laminate by a rubber plate before applying the hot pressure.

In example 9, the subject matter of any of examples 1 to 8 can optionally include a lateral dimension of the heatable plate being at least 1 cm larger than a lateral dimension of the substrate.

In example 10, the subject matter of any of examples 1 to 9 can optionally include the heatable plate being a steel plate.

In example 11, the subject matter of any of examples 1 to 10 can optionally include the temperature at the location located vertically above the edge of the substrate during applying the hot pressure being higher than 60° C.

In example 12, the subject matter of any of examples 1 to 11 can optionally include the temperature at the location located vertically above the edge of the substrate during applying the hot pressure being at least 10° C. lower than the average temperature of the surface temperature distribution within the center area.

In example 13, the subject matter of any of examples 1 to 12 can optionally include the average temperature of the surface temperature distribution within the center area of the heatable plate being lower than 200° C. during applying the hot pressure.

In example 14, the subject matter of any of examples 1 to 13 can optionally include a temperature variation within the center area of the heatable plate being lower than 5° C. during applying the hot pressure.

In example 15, the subject matter of any of examples 1 to 14 can optionally include a lateral dimension of the substrate being larger than 200 mm and smaller than 1 m.

In example 16, the subject matter of any of examples 1 to 15 can optionally include a thickness of the substrate being larger than 70 µm and smaller than 3 mm.

In example 17, the subject matter of any of examples 1 to 16 can optionally include the substrate being a panel substrate, a wafer or a printed circuit board.

In example 18, the subject matter of any of examples 1 to 17 can optionally include the substrate comprising a polymer multilayer core comprising a plurality of later wiring layers and vertical wiring layers.

In example 19, the subject matter of any of examples 1 to 18 can optionally include the edge area of the heatable plate extending from the center area to the edge of the heatable plate, wherein a smallest distance between the center area and the edge of the heatable plate is larger than 2% of a lateral dimension of the heatable plate.

In example 20, the subject matter of any of examples 1 to 19 can optionally include a maximal temperature within the edge area of the heatable plate during applying the hot pressure occurring at a transition to the center area.

In example 21, the subject matter of any of examples 1 to 21 can optionally include the substrate comprising a plurality of substrate units, wherein the method further comprises separating the substrate units of the plurality of substrate units from each other.

Example 22 is an apparatus for applying pressure to an electrically insulating laminate located on a substrate, the apparatus comprising a carrier structure configured to carry a substrate; and a heatable plate configured to apply hot pressure to an electrically insulating laminate located on a substrate carried by the carrier structure, wherein the heatable plate is configured to generate a laterally varying surface temperature distribution at a surface of the heatable plate so that an average temperature of a surface temperature distribution within a center area of the heatable plate is higher than 80° C. and a temperature of the heatable plate within an edge area decreases from the center area towards an edge of the heatable plate during applying the hot pressure, wherein a temperature at a location located vertically above an edge of the substrate during applying the hot pressure is at least 5° C. lower than the average temperature of the surface temperature distribution within the center area, wherein the center area extends over at least 30% of a total area of the heatable plate, wherein the edge area of the heatable plate laterally surrounds the center area.

In example 23, the subject matter of example 22 can optionally include the heatable plate comprising a first heater structure for heating the center area of the heatable plate and a second heater structure for heating the edge area of the heatable plate, wherein the first heater structure is configured to heat the center area so that the average temperature of the surface temperature distribution within the center area of the heatable plate is higher than 80° C. during applying the hot pressure, wherein the second heater structure is configured to heat the edge area so that the temperature at the location located vertically above the edge of the substrate during applying the hot pressure is at least 5° C. lower than the average temperature of the surface temperature distribution within the center area.

In example 24, the subject matter of example 22 or 23 can optionally include a control circuit configured to control the temperature distribution at the surface of the heatable plate during applying the hot pressure.

Example 25 is a machine readable storage medium including program code, when executed, to cause a machine to perform the method of any of examples 1 to 21.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for forming substrate structure for an electrical component, the method comprising:
    placing an electrically insulating laminate on a substrate; and
    applying hot pressure to the electrically insulating laminate by a heatable plate, wherein an average temperature of a surface temperature distribution within a center area of the heatable plate is higher than 80° C. during applying the hot pressure, wherein the center area extends over at least 30% of a total area of the heatable plate, wherein an edge area of the heatable plate laterally surrounds the center area, wherein a temperature of the heatable plate within the edge area decreases from the center area towards an edge of the heatable plate during applying the hot pressure, wherein a temperature at a location located vertically above an edge of the substrate during applying the hot pressure is at least 5° C. lower than the average temperature of the surface temperature distribution within the center area.

2. The method according to claim 1, wherein a plurality of electrically conductive structures are located at a surface of the substrate before placing the electrically insulating laminate on the substrate, wherein portions of the electrically insulating laminate are pressed into regions located laterally between the electrically conductive structures of the plurality of electrically conductive structures during applying the hot pressure.

3. The method according to claim 2, wherein the electrically conductive structures of the plurality of electrically conductive structures protrude from the surface of the substrate by more than 10 um before placing the electrically insulating laminate on the substrate.

4. The method according to claim 2, further comprising forming openings extending from a surface of the electrically insulating laminate to the plurality of electrically conductive structures after applying the hot pressure.

5. The method according to claim 1, wherein the electrically insulating laminate is a thermoplastic laminate having a glass transition temperature lower than the average temperature of the surface temperature distribution within the center area of the heatable plate during applying the hot pressure.

6. The method according to claim 1, wherein the electrically insulating laminate extends over the whole substrate.

7. The method according to claim 1, wherein the electrically insulating laminate comprises a thickness of more than 10 um and less than 50 pm.

8. The method according to claim 1, further comprising applying pressure to the electrically insulating laminate by a rubber plate before applying the hot pressure.

9. The method according to claim 1, wherein a lateral dimension of the heatable plate is at least 1 cm larger than a lateral dimension of the substrate.

10. The method according to claim 1, wherein the heatable plate is a steel plate.

11. The method according to claim 1, wherein the temperature at the location located vertically above the edge of the substrate during applying the hot pressure is higher than 60° C.

12. The method according to claim 1, wherein the temperature at the location located vertically above the edge of the substrate during applying the hot pressure is at least 10° C. lower than the average temperature of the surface temperature distribution within the center area.

13. The method according to claim 1, wherein the average temperature of the surface temperature distribution within the center area of the heatable plate is lower than 200° C. during applying the hot pressure.

14. The method according to claim 1, wherein a temperature variation within the center area of the heatable plate is lower than 5° C. during applying the hot pressure.

15. The method according to claim 1, wherein a lateral dimension of the substrate is larger than 200 mm and smaller than 1 m.

16. The method according to claim 1, wherein a thickness of the substrate is larger than 70 um and smaller than 3 mm.

17. The method according to claim 1, wherein the substrate is a panel substrate, a wafer or a printed circuit board.

18. The method according to claim 1, wherein the substrate comprises a polymer multi-layer core comprising a plurality of lateral wiring layers and vertical wiring layers.

19. The method according to claim 1, wherein the edge area of the heatable plate extends from the center area to the edge of the heatable plate, wherein a smallest distance between the center area and the edge of the heatable plate is larger than 2% of a lateral dimension of the heatable plate.

20. The method according to claim 1, wherein a maximal temperature within the edge area of the heatable plate during applying the hot pressure occurs at a transition to the center area.

21. The method according to claim 1, wherein the substrate comprises a plurality of substrate units, wherein the method further comprises separating the substrate units of the plurality of substrate units from each other.

22. An apparatus for applying pressure to an electrically insulating laminate located on a substrate, the apparatus comprising:
  a carrier structure configured to carry a substrate; and
  a heatable plate configured to apply hot pressure to an electrically insulating laminate located on a substrate carried by the carrier structure, wherein the heatable plate is configured to generate a laterally varying surface temperature distribution at a surface of the heatable plate so that an average temperature of a surface temperature distribution within a center area of the heatable plate is higher than 80° C. and a temperature of the heatable plate within an edge area decreases from the center area towards an edge of the heatable plate during applying the hot pressure, wherein a temperature at a location located vertically above an edge of the substrate during applying the hot pressure is at least 5° C. lower than the average temperature of the surface temperature distribution within the center area, wherein the center area extends over at least 30% of a total area of the heatable plate, wherein the edge area of the heatable plate laterally surrounds the center area.

23. The apparatus according to claim 22, wherein the heatable plate comprises a first heater structure for heating the center area of the heatable plate and a second heater structure for heating the edge area of the heatable plate, wherein the first heater structure is configured to heat the center area so that the average temperature of the surface temperature distribution within the center area of the heatable plate is higher than 80° C. during applying the hot pressure, wherein the second heater structure is configured to heat the edge area so that the temperature at the location located vertically above the edge of the substrate during applying the hot pressure is at least 5° C. lower than the average temperature of the surface temperature distribution within the center area.

24. The apparatus according to claim 22, further comprising a control circuit configured to control the temperature distribution at the surface of the heatable plate during applying the hot pressure.

* * * * *

UNITED STATES PATENT AND TRADEMARK OFFICE
CERTIFICATE OF CORRECTION

PATENT NO. : 10,384,431 B2
APPLICATION NO. : 15/475157
DATED : August 20, 2019
INVENTOR(S) : Ji Yong Park et al.

Page 1 of 1

It is certified that error appears in the above-identified patent and that said Letters Patent is hereby corrected as shown below:

In the Claims

Column 12, Line 56 and Column 13, Lines 5 and 34 for the unit reading 'um', each occurrence, should read -μm-.

Signed and Sealed this
Third Day of December, 2019

Andrei Iancu
*Director of the United States Patent and Trademark Office*